United States Patent [19]

Clark et al.

[11] Patent Number: 4,602,227
[45] Date of Patent: Jul. 22, 1986

[54] COAXIAL LC PHASE-SHIFTER FOR PHASE-CONTROLLED TELEVISION BROADCAST SWITCHING CIRCUIT

[75] Inventors: Raymond N. Clark, Cherry Hill; Anthony N. Schmitz, Mt. Laurel Township, Burlington County, both of N.J.

[73] Assignee: RCA Corporation, Princeton, N.J.

[21] Appl. No.: 635,926

[22] Filed: Jul. 30, 1984

[51] Int. Cl.⁴ .......................... H01P 5/16; H03H 7/48
[52] U.S. Cl. .................................. 333/109; 333/101; 333/160; 333/263
[58] Field of Search ............... 333/109, 159, 160, 224, 333/226, 235, 253, 263, 101

[56] References Cited

U.S. PATENT DOCUMENTS

| | | | |
|---|---|---|---|
| 2,437,067 | 3/1948 | Bingley | 333/160 |
| 2,440,269 | 4/1948 | Hargrove | 333/235 X |
| 2,774,044 | 12/1956 | Silvey et al. | 333/263 X |

OTHER PUBLICATIONS

Microwave Engineering by A. F. Harvey, pp. 107–115, published 1963 by Academic Press.
"Principles of Radar" by Reintjes & Coate, published 1952 by McGraw-Hill at pp. 635–636.
NHK Technical Report NHK 8-2-82, entitled "A Crossover-Type System for Switching 10-kW VHF Television Broadcasting Transmitters"—English Language Translation.
Report ITEJ 10-4-82 entitled "A 10-kW VHF Transmitter Using a Continuous Change-Over Switch".

Primary Examiner—Paul Gensler
Attorney, Agent, or Firm—Joseph S. Tripoli; Robert L. Troike; William H. Meise

[57] ABSTRACT

A television broadcast transmitter includes two power amplifiers or transmitters, a dummy load and an antenna. A noncontacting switching arrangement includes directional couplers or hybrids operated as controllable phase-shifters under the control of pairs of variable reactive terminations. Signals arriving at the antenna or load port by two paths combine in-phase to couple signal to that port, or combine out-of-phase to cancel signal. If the out-of-phase condition is inaccurate, cancellation may be incomplete, resulting in crosstalk. To avoid the need for accurate positioners to position the variable reactive termination at the position providing the desired phase-shift, a particular structure of the reactive termination is used. The reactive termination is a short-circuited coaxial line with an axial gap in the center conductor at a position less than one quarter operating frequency wavelength from the short circuit. The center conductor is hollow around the gap and lined with insulating material, and an elongated conductive slug is actuated to selectively occupy one or two positions within the center conductor, one position remote from the gap whereby a minimum series capacitance results, and the second position straddling the gap, whereby the series capacitance increases. The slug is actuated by a rod passing through the short circuit. The rate of change of phase-shift as a function of actuator position is small near the extremes of actuation positions, whereby errors in actuator position do not affect the phase-shift.

18 Claims, 6 Drawing Figures

COAXIAL LC PHASE-SHIFTER FOR PHASE-CONTROLLED TELEVISION BROADCAST SWITCHING CIRCUIT

This invention relates to television broadcast transmitters and particularly to noncontact arrangements for switching a plurality of high-power signal sources to a plurality of load circuits by use of coaxial inductance-capacitance (LC) phase-shifters.

Television broadcasters supply television signals to an antenna for broadcasting to the public. Very often, the income of a television broadcaster depends upon fees charged to advertisers who desire to reach the public with their messages. In order to maximize his income, a broadcaster attempts to maximize the number of members of the public capable of receiving his signal. He may do this by increasing his antenna gain and the height of the antenna above the surrounding terrain so as to increase the line-of-sight distance to the horizon. He may also choose to couple the maximum possible television signal power to the antenna, and to keep the broadcasting station operating under all conditions. One way to increase the signal power coupled to the antenna is to install a single large transmitter or power amplifier and its ancillary equipment, and to couple this single transmitter to the antenna. This has the disadvantages that routine maintenance to the transmitter may require down-time (time in which the transmitter is not operating), and similarly a failure of the single transmitter renders the broadcasting station inoperative. It is also known to use two transmitters or high-power amplifiers in parallel and to couple the power from each of the transmitters to the antenna, as described for example in U.S. Pat. No. 4,238,855 issued Dec. 9, 1980 to Zborowski. This has the advantage of improved reliability, in that operation at reduced power continues if one of the transmitters fails, and further has the advantage that a given output power can be achieved by the use of a plurality of inexpensive low power output stages rather than by means of a single expensive high-power unit.

It is often necessary to operate a transmitter into a dummy load in order to perform tests, and for alignment, and signal switching is therefore necessary. Motor-driven contractors may be used for switching to couple one of two transmitters to an antenna, while the other is maintained in a standby condition in case the on-line transmitter should fail or in the event that routine maintenance is required. It has been found, however, that it is disadvantageous to use contactors for switching the output of a transmitter from an antenna to a load or from a load to an antenna while the transmitter is in full operation, because of various problems related to arcing at the contactor and changes in transmission-line impedance while the contactors are operating, which may cause high voltages to appear at the output of the transmitter. When contactors are used to switch the output of a transmitter, it is common to shut down the transmitter by removing the energizing voltage therefrom before the contactor is operated to switch the output circuit. This mode of operation, however, is very disadvantageous to a broadcaster who does not wish to have any broadcast down-time, since it may take several seconds to shut down the operating transmitter, operate the motor drive to the contactor, and start up the substitute transmitter.

In order to allow switching of the transmitter output while energized, phase-shift-controlled switching has been developed. Generally speaking, an arrangement for such switching includes directional or hybrid coupling circuits for combining the outputs of two transmitters and for coupling them by way of two paths to a further hybrid having one output coupled to the antenna and another coupled to the dummy load. Each of the two paths includes a controllable phase-shifter, each phase-shifter including a further hybrid circuit and controllable reactive terminations. Such an arrangement, described in greater detail below, allows both transmitters to be operated simultaneously and allows the signals to be switched between the antenna and load without the switching of contacts and without deenergizing the transmitters. Instead, the switching is accomplished by selective control of the reactive terminations associated with the circuit. Control of the reactances causes the signals arriving at the antenna or the load by the two paths to be either in-phase and therefore add, or to be out-of-phase and therefore cancel.

While the aforementioned phase-shift switching eliminates the problems associated with contactors, several undesirable characteristics remain. The motorized vacuum capacitors used for the reactive terminations are relatively slow in operation, because of the screw drives required to maintain vacuum integrity. Thus, the change in phase required to effect switching may take several seconds, notwithstanding that the transmitters need not be de-energized during the switching. Also, the capacitor motor-drive and control circuits must be made with great precision, for slight errors in the resting position of the motor-driven capacitor at either extreme of operation may result in incorrect values of terminating reactance and corresponding incorrect phase-shift. Since switching of a signal away from an output port is accomplished by cancellation of two oppositely-phased signals, slightly incorrect phase in a path to the cancellation point may result in failure to cancel, which in turn results in undesired cross-talk (insufficient isolation) between signals at the loads. Furthermore, the vacuum capacitors used in the prior art are expensive, subject to a failure mode in which the vacuum seal is lost, and may not be available in the combinations of capacitance values and power-handling capability which are desired.

Vacuum capacitors may also have power-dissipation problems resulting from the high current flows at high power levels, because the vacuum prevents convention cooling.

SUMMARY OF THE INVENTION

A controlled-reactance signal switching arrangement for switching high-power signals from a plurality of sources to a plurality of loads includes reactive terminations. The reactive terminations include a coaxial variable capacitor in series with a coaxial inductance. In a particular embodiment of the invention, the series coaxial capacitance includes a coaxial outer conductor and a hollow inner conductor having a gap. A conductive slug is located within the hollow center conductor and is movable between a positive straddling the gap and a position remote from the gap for varying the capacitance across the gap.

DESCRIPTION OF THE DRAWING

FIG. 1a is a block diagram of a broadcast site including a pair of transmitters, phase-shifters, a load and an antenna, and FIG. 1b tabulates the positions of phase-shifting actuators for various operating modes;

FIG. 2a is a table explaining the relative phases of various signals in the arrangement of FIG. 1a and FIG. 2b illustrates phase angles referred to in FIG. 2a;

FIG. 3a is a longitudinal cross-section, FIG. 3b is a lateral cross-section, and FIG. 3c is a perspective view of a simplified 3 dB coupler which may be used in the arrangement of FIG. 1a;

FIG. 4 is a plot of relative phase shift versus control actuator travel for the arrangement of FIG. 4; and FIG. 6 is a diagram, partially in pictorial and partially in schematic form aiding in understanding the control of the arrangement of FIG. 1a.

DESCRIPTION OF THE INVENTION

Figures 1A, 1B:
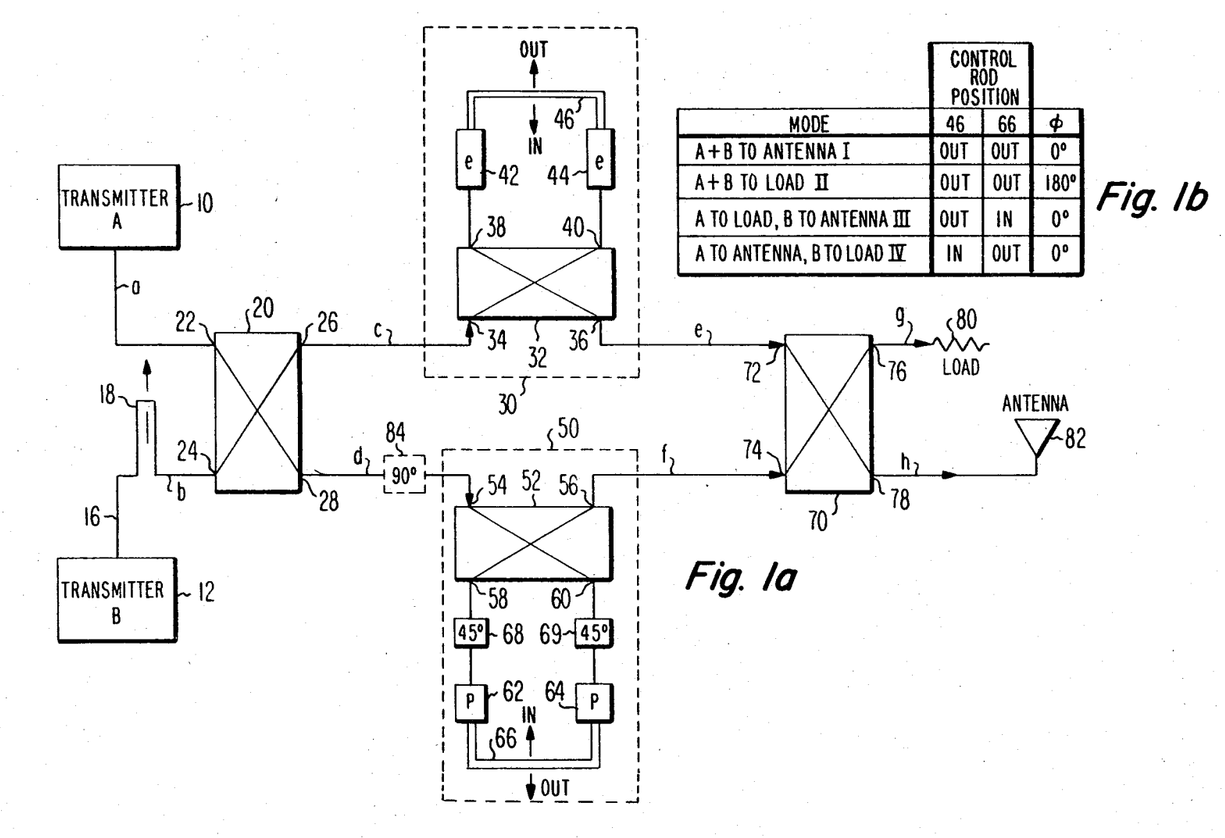

Generally speaking, the arrangement of FIG. 1a consists of first (A) and second (B) power amplifiers or transmitters, the A and B signal outputs, respectively, of which are coupled to a first 3 dB directional coupler or hybrid 20. Coupler 20 couples half the signal (−3 dB) applied at each input port 22, 24 to each output port 26, 28. That half of the signal coupled to the output port adjacent the input port is not phase-shifted, whereas that half of the input signal appearing at an output port by means of a transmission line (each of which is illustrated by one of the crossed lines in coupler 20) are phase-shifted by 90 degrees, which represents the quarter-wave length of the transmission line at the operating frequency. Thus, each of the two output signals from coupler 20 consists of non-phase-shifted first input signal plus 90-degree-phase-shifted second input signal. These two sum signals, which appear at output terminals 26, 28, are coupled by way of conductors c and d to a pair of phase-shifters designated generally as 30 and 50, which control the phases of the sum signals and apply phase-shifted sum signals by way of conductors e and f to input ports 72, 74 of a further 3 dB coupler 70. The phase shifts imparted to the signals are selected so that when operated upon by coupler 70 in the same manner as by coupler 20, the output signals on conductors g and h for application to a load and to an antenna, respectively, cancel or add, as the case may be, in order to accomplish switching. Each of the phase-shifters 30, 50 includes a further 3 dB coupler and a pair of controllable reactive terminations.

Figure 3A:
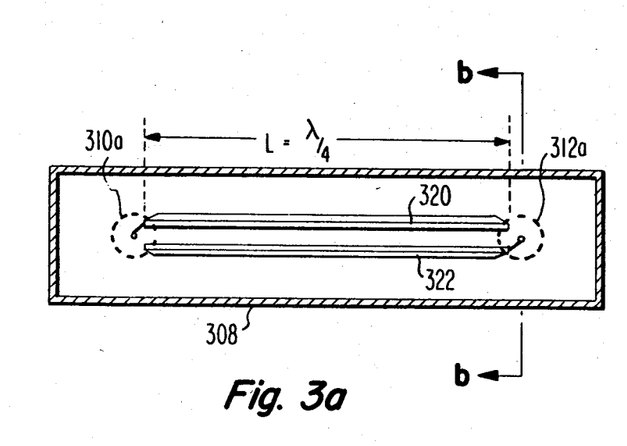
Figure 3B:
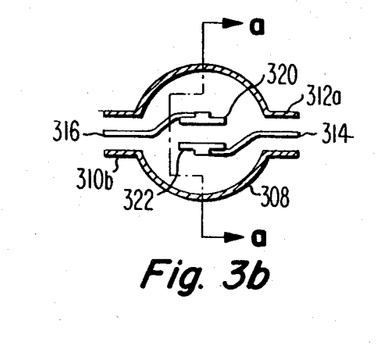
Figure 3C:
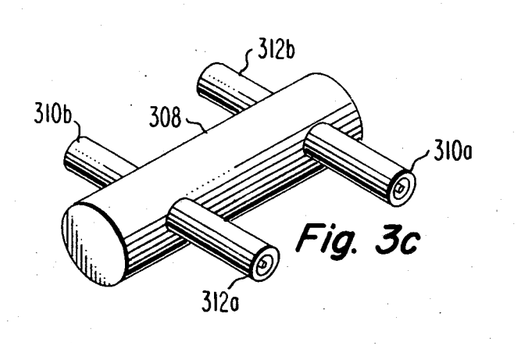

Each 3 dB directional coupler or hybrid is constructed as illustrated in cross-section in FIGS. 3a and 3b, and as illustrated in perspective view in FIG. 3c. FIGS. 3a-3c illustrate generally two coaxial transmission lines 310a, 310b; 312a, 312b which are coupled in a region enclosed by a common outer conductor 308. The center conductors, such as center conductors 314 and 316 of the coaxial transmission lines 310, 312, are connected to off-center transmission-line conductor portion 320, 322, which are elongated generally flat conductors spaced apart in a parallel configuration. The spacing of conductors 320, 322 is selected to provide capacitive and magnetic coupling over a distance of approximately one quarter-wavelength at the frequency of operation, for providing a directional coupling characteristic as known in the art. The characteristics of directional couplers and hybrid junctions are described at pages 107-115 in the test Microwave Enginnering, A. F. Harvey, published 1963 by Academic Press.

In FIG. 1a, an A transmitter or high-power amplifier 10 and a B transmitter or high-power amplifier 12 produced high-power A and B television signals on conductors a and b, respectively. These signals may each be, for example, 30 kW at VHF high-band (174–216 MHz). The signals on conductor or transmission line a are coupled to an input port 22 of 3 dB coupler 20. The A and B signals may be required to be phase-coherent for certain operating modes. The signal from transmitter B is applied to a second input port 24 of 3 dB coupler 20 by way of conductor 16, 0–180 degree phase ($\phi$) shifter 18 and conductor b. Phase-shifter 18 is normally set for 0° phase-shift, except for the mode of "A + B TO LOAD"; in which case it is set to 180°, as tabulated in the $\phi$ column of FIG. 1b. A first output signal consisting of the sum of −3 dB or half-power A signal with 0° phase shift (A/2∠0°) and 90-degree phase-shifted B signal (B/2∠90°) is taken from a third output port 26 of coupler 20 for application by way of conductor c to a first input port 34 of a further 3 dB coupler 32 of phase-shifter 30. Signal is taken from a fourth output port 28 of coupler 20 over a conductor d, which signal is the sum of half the B signal without additional phase shift (B/2∠0°) plus half the A signal delayed or phase-shifted by 90 degrees ((A/2∠90°) which sum (A/2∠90°+B-/2∠0°) is applied by way of conductor d to a first input port 54 of a 3 dB coupler 52 of phase-shifter 50. In FIG. 2a and throughout the remainder of the description the sum is referred to as A∠90° B∠0°, since the relative amplitudes are apparent, and only the phase requires explanation.

The sum signal applied to input port 34 of coupler 32 is coupled without phase shift and at half amplitude to output terminal 38, and is reflected with a preselected phase angle by reactive termination 42. The signal reflected by termination 42 is applied as an input signal to port 38 and is coupled with a further 90° phase shift to output port 36. Thus, that portion of the signal coupled from input terminal 34 to terminal 38 appears at port 36 with a phase shift which is the sum of 90° plus the phase shift imparted by reactive termination 42. A second portion of the input signal applied to input port 34 is coupled along a transmission-line to an output port 40 with a 90° phase shift. The signal leaving port 40 is reflected by reactive termination 44 and reapplied to port 40 with a phase-shift established by the reactance of the termination. The reflected signal applied to port 40 is coupled with 0° phase shift to output port 36 to be added to that portion reflected from reactive termination 42. This second portion of the signal applied at port 34 is coupled to port 36 with a phase-shift of 90° plus the phase shift attributable to reactive termination 44. Thus, the signal applied to input port 34 is coupled to port 36 by two paths having a phase-shift of 90° plus the phase-shift of the reactive termination. If the reactive terminations are identical, the phase-shift imparted to the signal by either path is identical. Reactive terminations 42 and 44 are identical and are actuated together, so that each presents the same reactance to its output port 38, 40. Thus, the total phase shift from port 34 to port 36 is 90° plus the phase-shift imparted by one of terminations 42, 44.

Similarly, the signal applied to input terminal 54 of coupler 52 is divided into two portions, one portion of which is coupled to output terminal 58 with no phase shift, passes through a delay line 68 having a length of $\lambda/8$ (45°) is reflected with a predetermined phase angle by a reactive termination 62, and the reflected signal is further delayed by 45° by a second passage through delay line 68 before being applied as an input signal to terminal 58. The reflected signal arriving at terminal 58 is conducted by a coupler transmission line to outport port 56 with an additional phase-shift of 90°, so that the total phase-shift between ports 54 and 56 by way of port 58 is is the sum of 45°, the phase angle due to reactive termination 62, 45° and 90°, for a total of 180° plus the reactance of reactive termination 62. Similarly, half the input signal applied at input terminal 54 is coupled to output port 60 of coupler 52 with a 90° phase shift, and is phase-shifted by a further 45° by a delay 69, reflected from reactive termination 64 with a further predetermined phase angle, and re-delayed by a further 45° by delay line 69 before being coupled without further phase shift from port 60 to port 56. Thus, the signal coupled from input terminal 54 to output terminal 56 of coupler 52 by either path is phase-shifted by 180° plus the phase-shift of one of the reactive terminations. As in the case of phase-shifter 30, phase-shifters 62 and 64 of phase-shifter 50 are identical and actuated together to present the same phase angle of reactive termination to their respective transmisision lines.

The phase-shifted signals on conductors e and f are applied to input terminals 72 and 74, respectively, of a directional coupler 70. Half the signal arriving at port 72 by way of conductor e is coupled without phase shift to output port 76 of coupler 70, and the other half is coupled with a 90° phase shift to output port 78. Similarly, half the signal applied over conductor f to input port 74 of coupler 70 is coupled without phase shift to output port 78, and the other half is applied with a 90° phase shift to output port 76. FIG. 2a tabulates the phase-shifts on conductors a–h for various operating or switching modes. For the sake of simplicity, the modes are designated by Roman numerals as follows:

I. A+B To Antenna
II. A+B To Load
III. A To Load, B To Antenna
IV. A To Antenna, B To Load For each Mode tabulated in FIG. 2a, each column shows two values, one in the upper part and one in the lower part of each intersection of a row and column. These correspond to the values of the upper and lower portions of the column headings.

Considering first the simple case of the operating mode "A to antenna, B to load" (Mode IV), FIG. 2a, column 1 indicates that the phase of the A signal on conductor a is 0° (reference phase), and similarly the B signal on conductor b has zero phase. For Modes III and IV, there is no necessary phase relation between the A and B signals, nor do they necessarily even have to be at the same frequency, as will become clear when considering the additions at the load and antenna. Column 2 indicates that the signal on conductor c consists of a sum signal A with 0° phase (relative to the signal at port 22) and B with 90° phase (relative to the signal at port 24). This is termed (A∠0° B∠90°). The 90° phase of signal B is attributable to the phase-shift from ports 24 to 26 of coupler 20, previously described. While the amplitudes of the A and B signals appearing on conductors c through f(c–f) are reduced, the reduction in amplitude is not indicated in the table of FIG. 2a since the table is intended principally to indicate phase. The signal on conductor d is A phase 90° B phase 0° (A∠90° B∠0°). The intrinsic or minimum phase shift of phase-shifter 30 is 90°, and that of phase-shifter 50 is 180°, as indicated in column 3 of FIG. 2a. For Mode IV, reference to FIG. 1b indicates that the phase-shifter actuator 46 associated with phase-shifter 30 is IN and that actuator 66 for phase-shifter 50 is OUT, which correspond to 90° and 0° phase angle of the reflected wave of each reactive termination, respectively, as indicated in column 4 of FIG. 2a. The total phase shift for phase shifters 30, 50 is indicated in column 5 of FIG. 2a. Column 6 indicates the relative phase of the signals on conductors e and f after phase-shifting by the amount designated in column 5. From column 6, we see that for Mode IV conductor 3 has an A-derived signal with phase shift of 180° and a B-signal with a phase shift of 270° (A∠180° B∠270°) while conductor f has A∠270° B∠180°. As mentioned, the signal at output port 76 of coupler 70 includes components from each of input ports 72 and 74. Column 7 of FIG. 2a specifies that conductor g carries A∠180° B∠270° (the values from column 6) plus A∠0° B∠270° (the values from column 6 for conductor f, phase-shifted by an additional 90° due to coupler 70). It will be noted that there are on conductor g two B signal components, each with a phase angle of 270°, which add in-phase as specified in column 8. Also on conductor g are two A components, one with phase 180° and the other phase 0°, which cancel. Thus, there is no A component on conductor g for application to the load. Consequently, the B signal is designated as being applied to the load in column 9 of FIG. 2a and as required by Mode IV. From column 7 of FIG. 2a, it is noted that the h conductor has components A∠270° B∠180° (the values from column 6) plus A∠270° B∠0° (the value specified for conductor e in column 6, further phase-shifted by 90°). Thus, conductor h has two A components at the 270° phase angle, which add to produce an A signal to the antenna as indicated by column 9, but the B components at 0° and 180° cancel, so that no B component appears at the antenna. Thus, in Mode IV, the A component is applied to the antenna and the B component is applied to the load.

In the "A+B to antenna" mode (Mode I), the A and B signals on conductors a and b begin in-phase as before, and the phase-shifts on conductors a and d are the same as those for Mode IV. Intrinsic phase-shifts of phase shifters 30 and 50 as specified in column 3 do not change as a function of mode. However, for Mode I both actuators are OUT, thus causing 0° additional shift (column 4) so that the total phase shift for phase shifters 30, 50 are 90°, 180°, respectively (column 5). The signal on conductor e is the signal from conductor c phase-shifted by 90°, which is A∠90° B∠180° as specified in column 6, and the signal on conductor d (from column 2) when phase-shifted by 180° (column 5) becomes on conductor f A∠270° B∠180°. For Mode 1, the signal on conductor g is A∠90° B∠180° plus A∠0° B∠270° and the signal on conductor h is A∠270° B∠180° plus A∠180° B∠270°. It will be noted that conductor g has two A components, one at 0° and one at 90°, which produces a resultant A signal component at 45° as specified in column 8, and the B components have a vector sum at 225°. Referring to FIG. 2b, it will be seen that vectors at 45° and 225° are exactly out-of-phase, so that if the A and B signals start out phase coherent and in-phase (column 1), they will cancel at the load, as desired. The signal on conductor h, on the other hand, has two A components at phases 180° and 270°, which have a resultant at 225° and the B components similarly have a resultant at 225° whereby the A and B components add in-phase at the antenna port, as desired for Mode I.

From the foregoing explanation, Modes 2 and 3 should be readily understandable by reference to FIG. 2a. It is noted that for Mode 2, phase-shifter 18 is thrown to the 180° position so that the B signal component on conductor b is out-of-phase with the A component.

Figure 4:
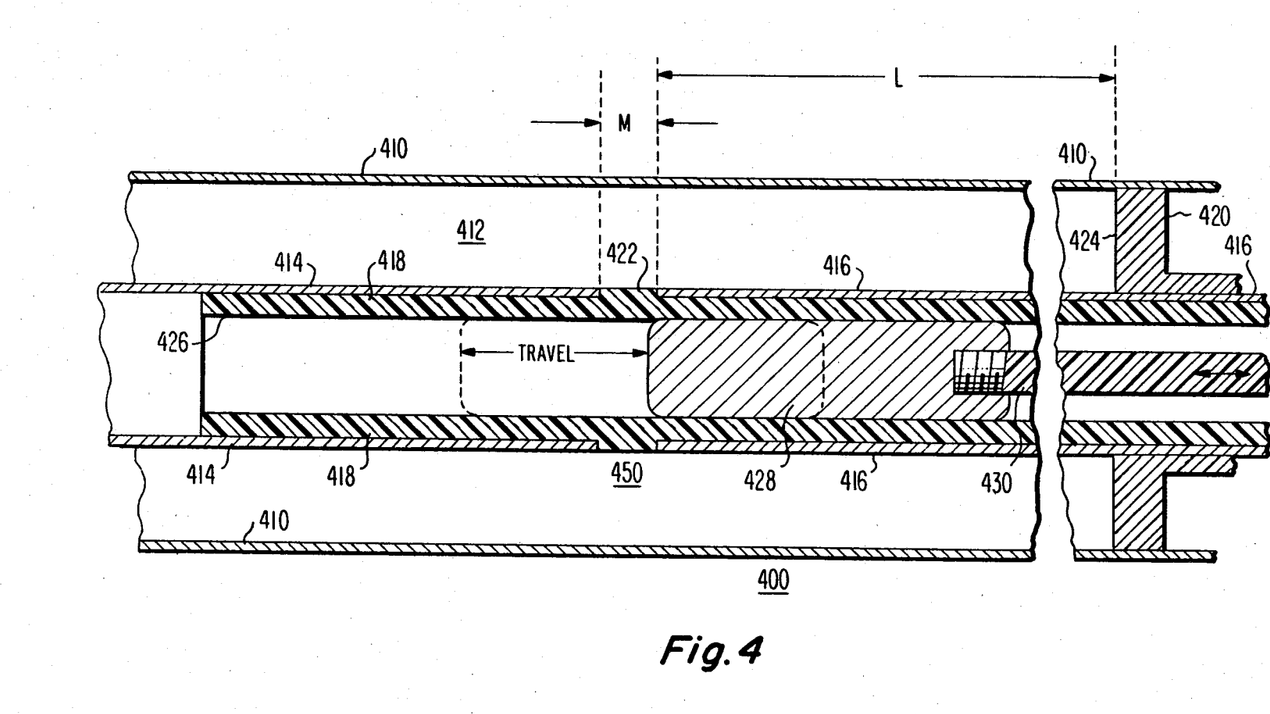
FIG. 4 is a cross-sectional view of a reactive termination according to an embodiment of the invention.

FIG. 4 is a simplified cross-sectional view of one of reactive terminations 42, 44, 62, 64, designated 400. Reactive termination 400 includes an outer conductor 410 and a concentric inner conductor designated generally as 412 adapted to be coupled to a coaxial port of a directional coupler. Inner conductor 412 includes a first conductive portion 414 and a second conductive portion 416. Center conductor portion 414 is supported at its left end by an insulating spacer (not shown) or by other suitable means. Within the region illustrated in FIG. 4, center conductor section 414 is supported by a dielectric cylinder 418, the outer diameter of which fits within the inside diameter of a hollow within center conductor 414. Dielectric cylinder 418 is in turn fitted within and supported by center conductor section 416. Center conductor 416 is electrically short-circuited to outer conductor 410 and mechanically supported in relation to outer conductor 410 by a cylindrical shorting member 420. Center conductor sections 414 and 416 are spaced apart axially by an annular raised portion or ridge 422 on the surface of dielectric cylinder 418. The dimensions of raised portion 422 are preselected to maintain a predetermined axial separation between center conductor portions 414 and 416. The separation establishes an axial gap designated generally as 450 between center-conductor sections 414 and 416, with axial dimension M. The dimension L between the front face 424 of shorting member 420 and gap 450 is preselected to a value less than one quarter-wavelength at the frequency of operation to establish a particular value of inductive reactance at the gap. The length L depends upon the frequency of operation of the television channel with which the reactive termination is to be used and is tabulated below.

As so far described, coaxial reactive termination 400 is coupled at its left end by an input port (not shown) to an output port (such as 38, 40) of coupler 32 or to an output port such as 58, 60 of coupler 52 by way of coaxial phase-shifter 68, 69). As seen from the input port (not shown) at the left end of reactive termination 400, the gap established by raised portion 422 is large enough so that the capacitance is very small, so that the capacitance reactance is as a practical matter infinite, whereby the termination appears to be open-circuit or provides a zero degree reflection coefficient.

The capacitance across the gap is increased by a conductive cylinder 428 dimensioned to fit and slide within a bore 426 within dielectric cylinder 418. The dielectric cylinder galvanically (conductively) isolates conductive cylinder 428 from conductive inner conductor portions 414, 416. In the position illustrated, conductive cylinder 428 does not materially affect the capacitance between center conductor portions 414 and 416. Cylinder 428 is movable within bore 426 by an actuating push-rod 430 which is attached to one end of cylinder 428. Rod 430 is made of a nonconductive plastic. In the position illustrated by dotted lines in FIG. 4, with conductive cylinder 428 is a position straddling the gap there is a substantial capacitance between center conductor 414 and conductive cylinder 428, and also between center conductor 416 and cylinder 428. Thus, the very small capacitance between center conductor portions 414, 416 at either extreme of the travel of conductive cylinder 428 is paralleled by the series combination of two relatively large capacitances when conductive cylinder 428 straddles gap. In this center position of conductive cylinder 428, the impedance seen looking from the left end of reactive termination 400 towards the gap is the series combination of a capacitance and an inductance. It should be noted that bore 426 extends far enough to the left so that cylinder 428 may be positioned at an extreme position past gap 450, at which position it also does not materially affect the capacitance between center conductor portions 414 and 416.

FIG. 5 illustrates a plot of the relative phase delay of the reactive termination as a function of relative travel of the actuator rod. It can be seen that the phase delay or phase change is not linear as a function of the motion of the actuator. In fact, at an actuator position of about 0.3 inches (the OUT position) and at about 4 inches (IN), the rate of change of phase as a function of actuator travel is zero. This is a highly advantageous result, by comparison with the linear phase change as a function of actuator (rotary) travel of a vacuum capacitor. It will be readily understood that small errors in setting the actuating rod in the IN position will have no material effect on the desired 90° phase shift, and therefore the selected mode will be produced. By contrast, a linear phase-shift with actuation (whether it be a linear actuation or a rotary actuation) will be highly dependent upon precise setting of the actuator in order to effect the desired mode. FIG. 6 illustrates generally a phase-shifter such as 30 including coaxial reactive terminations 42, 44 according to the invention. As illustrated, the actuators 430 are in the OUT position. Actuators 430 of terminations 42, 44 are linked together by yoke 460 which is affixed to the shaft 612 of a linear motor 614. Shaft 612 has an end portion 616 arranged to actuate or toggle a first microswitch 620, and includes a second portion 618 arranged to actuate a second microswitch 622 at the other end of its travel. Microswitches 620 and 622 are illustrated in schematic form but include springs intended to return them to their closed states in the absence of actuation by 616, 618. A phase-shifting capacitor 624 is coupled across the motor windings in known fashion to provide a phase shift for establishing a motor drive force. Power is supplied from one side of the AC power line (not shown) to motor 614 by way of a power plug 626 and a circuit breaker 628. Power is supplied to the other side of the windings of motor 614 by way of an actuation direction selection switch 630, conductors 632 and 634 and microswitches 620, 622. In the position shown, switch 630 has applied power to conductor 634, which was previously coupled to conductor 636 and by way of capacitor 624 to conductor 638 to drive the motor in the OUT direction, until portion 616 of shaft 612 opened microswitch 620. In order to reverse the direction of operation, switch 630 is thrown to its alternate position (not shown) to apply power by way of conductor 632 and closed contacts of switch 622, to conductor 638, and by way of capacitor 624 to conductor 636. This will drive motor shaft 614 to the left as seen in FIG. 6, allowing switch 620 to return to its normal position, and when the limit of travel in the IN direction is reached, operating switch 622 to its open or nonconductive position by means of extension 618 on shaft 612. When switch 622 opens, the circuit opens, the motor stops and the system remains stable with actuator 430 in the IN position. A suitable linear motor for use as motor 614 is type 212-04-20 made by Innovex, Inc., 1313 Fifth Street South, Hopkins, Minn. The arrangement of FIG. 1a requires two control circuits, one for each pair of reactive terminations.

Because of the lack of sensitivity to actuating position of reactive terminations 400 at the extremes of travel (i.e., in the straddling and nonstraddling positions), the positions of microswitches 620 and 622 and the amount of overtravel do not need to be adjusted with extraordinary precision.

The following is a table of dimensions L for use with 50-ohm coaxial line having an outer conductor with an inside diameter of 3.027 inches and an inner conductor having an O.D. of 1.315 inches and I.D. of 1.231 inches, a gap 450 length of 0.75 inches and a capacitance changing cylinder 428 O.D. of 0.845 inches and length of 6.5 inches, fitted within a dielectric cylinder 418 made from Polytetrafluoroethylene (TEFLON trademark).

TABLE 1

| Channel | L (Inches) | $X_C$ | $X_L$ |
|---|---|---|---|
| 7 | 5.6 ($\lambda/6$) | 78 | 28 |
| 8 | 4.7 | 74 | 24 |
| 9 | 4.0 | 71 | 21 |
| 10 | 3.5 | 69 | 19 |
| 11 | 3.2 | 67.5 | 17.5 |
| 12 | 2.9 | 66 | 16 |
| 13 | 2.5 ($\lambda/11$) | 64.5 | 14.5 |

Other embodiments of the invention will be obvious to those skilled in the art. For example, coaxial delay lines 68 and 69 may be deleted from phase-shifter 50 if a further 90° phase-shifter such as 84 (illustrated in dotted lines in FIG. 1a) is added in the path through phase-shifter 50. Additional phase-shifts may be incorporated within the arrangement of FIG. 1a for other purposes, but the relative phases of the signals arriving at the load and antenna ports must add or cancel, as described. The antenna may as known be an array of multiple radiators.

If Mode II is not required, phase-shifter 18 may be deleted. In an actual operating system, a phase-shifter 18 may be set for 90° phase-shift in order to obtain ghost cancellation, and the additional phase-shifters required to obtain the proper phases at the input ports of coupler 20 are located at an exciter which is part of a transmitter 10.

As is known, the addition of lengths of transmission-line equal to $\lambda/2$ does not affect the input impedance of a termination as seen from an input port, so for narrow-band operation length L may include integer multiples of $\lambda/2$. For broadband operation, as across the frequency band of a television channel, the phase-shift of the reactive termination may change more than when length L is minimized.

What is claimed is:

1. An arrangement for controlling high-power, high-frequency first and second signals from first and second sources, respectively, for switching said first and second signals between first and second loads in a first mode of operation and for combining said first and second signals and applying the resulting combined signal to one of said first and second loads in a second mode of operation, said arrangement comprising:
    a first coupler comprising first, second, third and fourth ports, said first and second ports being input ports coupled to said first and second sources, respectively, and said third and fourth ports being output ports, each of which produces a combination signal resulting from a combination of said first and second signals;
    second and third couplers, each having an input port, an output port, and third and fourth additional ports, said input ports of each of said second and third couplers being coupled to said third and fourth output ports of said first coupler, respectively, for providing phase-shifts to said respective combination signals as they pass between said input and output ports of each of said second and third couplers;
    a fourth coupler comprising first and second input ports coupled to said output ports of said second and third couplers, respectively, for receiving phase-shifted combination signals therefrom, and further comprising a first output port coupled to said first load and a second output port coupled to said second load; and
    reactive terminating means coupled to said third and fourth additional ports of said second and third couplers for controlling the magnitude of said phase-shifts for selecting one of said first and second modes of operation, said reactive terminating means comprising first and second pairs of coaxial inductance-capacitance circuits, said first pair of coaxial inductance-capacitance circuits being coupled to said third and fourth additional ports of said second coupler, said second pair of coaxial inductance-capacitance circuits being coupled to said third and fourth additional ports of said third coupler, each of said coaxial inductance-capacitance circuits including elongated coaxial transmission-line means including an outer conductor without a gap, first and second portions of a hollow inner conductor concentric with said outer conductor, said first portion of said inner conductor being axially separated from said second portion of said inner conductor by a non-conductive gap, and the end of said second portion of said inner conductor remote from said gap being short-circuited to said outer conductor, the length of said second portion being less than one-quarter wavelength at said high frequency.

2. An arrangement according to claim 1 further comprising control means coupled to said reactive terminating means for controlling the capacitance of said coaxial inductance-capacitance circuits of said first pair as one unit, and for controlling said coaxial inductance-capacitance circuits of said second pair as a unit separate from said first unit.

3. An arrangement according to claim 1 wherein the length of said second portion of said inner conductor is selected to be within the range of $\lambda/6$ to $\lambda/11$ at said high frequency.

4. An arrangement according to claim 1 further comprising conductive capacitance varying means mechanically located within said hollow inner conductor and galvanically isolated therefrom, said conductive capacitance varying means being movable to a position remote from said gap whereby the capacitance across said gap is small and also being movable to a position straddling said gap whereby said gap provides a larger capacitance.

5. An arrangement according to claim 4 wherein said conductive capacitance varying means is elongated in the direction of said elongated coaxial transmission-line means whereby small errors is positioning said capacitance varyiing means in said position straddling said gap do not substantially affect the magnitude of said larger capacitance provided by said gap.

6. An arrangement according to claim 4 wherein said capacitance varying means is mechanically coupled to an actuating rod.

7. An arrangement according to claim 4 wherein each of said coaxial inductance-capacitance circuits comprises an actuating rod coupled to said capacitance varying means, and said actuating rods related to said first pair of coaxial inductance-capacitance circuits are mechanically coupled together, and said actuating rods related to said second pair of coaxial series inductance-capacitance circuits are mechanically coupled together.

8. An improved arrangement for switching signals from first and second sources of first and second high-power signals at a high operating frequency respectively, between first and second loads in a first mode of operation, and for combining said first and second signals from said first and second source for application to one of said first and second loads in a second mode of operation, said arrangement comprising:
first and second transmission-lines mutually coupled along quarter-wavelength portions for forming a first coupler, said first coupler having first and second ports each of which is coupled to one end of said quarter-wavelength portions of said first transmission-line, said first coupler having third and fourth ports each of which is coupled to one end of said quarter-wavelength portion of said second transmission-line;
third and fourth transmission-lines mutually coupled along quarter-wavelength portions for forming a second coupler, said second coupler having first and second ports, each of which is coupled to one end of said quarter-wavelength portion of said third transmission line, said second coupler having third and fourth ports, each of which is coupled to one end of said quarter-wavelength portion of said fourth transmission-line;
third and fourth couplers each including first and second input ports and third and fourth output ports;
said first source being coupled with said first input port of said third coupler, said second source being coupled with said second input port of said third coupler, said third output port of said third coupler being coupled with said first port of said first coupler, said fourth output port of said third coupler being coupled with said first port of said second coupler, said third port of said first coupler being coupled with said first input port of said fourth coupler; said third port of said second coupler being coupled with said second input port of said fourth coupler; said third output port of said fourth coupler being coupled with said first load; and said fourth output port of said fourth coupler being coupled with said second load, the improvement comprising
first and second coaxial inductance-capacitance circuits coupled to said second and fourth ports of said first coupler respectively, and third and fourth inductance-capacitance circuits coupled to said second and fourth ports of said second coupler, respectively, for providing a reactive termination for each of said second and fourth ports of said first and second couplers; and
each of said first, second, third and fourth coaxial inductance-capacitance circuits including
elongated coaxial transmission line means comprising an elongated outer conductor without a gap and an inner conductor, said inner conductor having a gap at a transverse location thereby dividing said inner conductor into a first portion proximate an input end of said coaxial inductance-capacitance circuit and a second portion remote from said input end, said inner conductor further including a hollow along at least a portion of its length in the vicinity of said gap;
conductive shorting means coupled to said second portion of said inner conductor and to said outer conductor for short-circuiting said inner conductor to said outer conductor at a location less than one quarter-wavelength at the operating frequency from said gap;
elongated conductive capacitance varying means movably located within said hollow to occupy a range of positions extending from a first position straddling said gap to a second position entirely within one of said first and second portions of said inner conductor; and
control means for controlling said capacitance varying means in pairs for controlling the coupling between said sources and said loads.

9. An arrangement according to claim 8 wherein said hollow is lined with a nonconductive material, and said capacitance varying means slides on said nonconductive material.

10. An arrangement according to claim 9 wherein said control means comprises a elongated rod coupled to said capacitance varying means and passing through the center of said second portion of said inner conductor.

11. A reactive coaxial termination, comprising:
a coaxial input port including a central termination and an outer termination;
elongated outer conductor means without a gap coupled to said outer termination, said outer conductor means having an axis;
first and second center-conductor portions coaxial with said outer conductor means, said first and second center-conductor portions being supported in positions providing an axial gap therebetween, said first and second center-conductor portions being hollow in a region about said gap, said first center-conductor portion extending from said gap through said outer conductor means to said central termination;
insulating means within said hollow region of said first and second center-conductor portions, said insulating means having a bore;
conductive short-circuiting means coupled to said outer conductor means at a point remote from said input port and from said gap and to said second center-conductor portion at a point remote from said gap, said short-circuiting means including an aperture through which said second portion of said center-conductor passes;
conductive capacitance varying means, said conductive capacitance varying means being adjustably locatable within said bore to a position remote from said gap and to a position straddling said gap; and
nonconductive actuating means, said nonconductive actuating means including a rod mechanically coupled to said conductive capacitance varying means and extending through and beyond said second center-conductor portion.

12. An arrangement for controlling high-power, high-frequency first and second signals from first and second sources, respectively, for switching said first and second signals between first and second loads in a first mode of operation and for combining said first and second signals and applying the resulting combined signal to one of said first and second loads in a second mode of operation, said arrangement comprising:
- a first coupler comprising first, second, third and fourth ports, said first and second ports being input ports coupled to said first and second sources, respectively, and said third and fourth ports being output ports, each of which produces a combination signal resulting from a combination of said first and second signals;
- a second coupler comprising first and second input ports adapted for receiving phase-shifted combination signal, and further comprising a first output port coupled to said first load and a second output port coupled to said second load;
- phase shifting means coupled to said first and second couplers for coupling and phase-shifting said combination signal from said third port of said first coupler to said first input port of said said second coupler and for coupling and phase-shifting said combination signal from said fourth port of said first coupler to said second input port of said second coupler, said phase shifting means comprising coupling means including an input port coupled to one of said third and fourth ports of said first coupler for receiving said combination signal therefrom and also including an output port coupled to one of said first and second input ports of said second coupler for coupling phase-shifted combination signal thereto, said coupling means further including third and fourth additional ports; and
- reactive terminating means coupled to said third and fourth additional ports of said coupling means for controlling the magnitude of said phase-shift for selecting one of said first and second modes of operation, said reactive terminating means comprising a pair of coaxial inductance-capacitance circuits, each member of said pair of coaxial inductance-capacitance circuits being coupled to one of said third and fourth additional ports of said coupling means, each of said coaxial inductance-capacitance circuits including elongated coaxial transmission-line means including an outer conductor without an axial gap and an inner conductor, said inner conductor including first and second portions concentric with said outer conductor, said first portion of said inner conductor being axially separated from said second portion of said inner conductor by a non-conductive gap, and the end of said second portion of said inner conductor remote from said gap being short-circuited to said outer conductor at a position selected so that the length of said second portion between said gap and the position of said short-circuit is less than one-quarter wavelength at said high frequency.

13. An arrangement according to claim 12 wherein said phase shifting means comprises
- second coupling means including an input port coupled to the other of said third and fourth ports of said first coupler for receiving said combination signal therefrom and also including an output port coupled to the other of said first and second input ports of said second coupler for coupling phase-shifted combination signal thereto, said second coupling means further including third and fourth additional ports; and
- further reactive terminating means coupled to said third and fourth additional ports of said second coupling means for controlling the magnitude of said phase-shift for selecting, in conjunction with said first-mentioned reactive terminating means, one of said first and second modes of operation, said further reactive terminating means comprising a second pair of coaxial inductance-capacitance circuits, each member of said second pair being coupled to one of said third and fourth additional ports of said second coupling means.

14. An arrangement according to claim 12 comprising control means for controlling the reactance of said reactive terminating means for selecting one of said first and second modes of operation.

15. An arrangement according to claim 14 wherein said first portion of said inner conductor is hollow at least in the region of said gap.

16. An arrangement according to claim 15 wherein said second portion of said inner conductor is hollow at least in the region of said gap, and further comprising:
- conductive capacitance varying means selectively located at a first position within said hollow of one of said first and second portions of said inner conductor whereby the capacitance across said gap is small and at a second position straddling said gap whereby said gap provides a larger capacitance; and
- control actuating means coupled to said control means and to said conductive capacitance varying means for selecting one of said first and second positions in said first mode of operation and for selecting the other of said first and second position in said second mode of operation.

17. An arrangement according to claim 15 wherein said conductive capacitance varying means is elongated in the direction of said elongated coaxial transmission-line means whereby small errors in positioning said capacitance varying means in said position straddling said gap do not substantially affect the magnitude of said larger capacitance provided by said gap.

18. An arrangement according to claim 17 wherein each of said coaxial inductance-capacitance circuits comprises an actuating rod, and said actuating rods related to said pair of coaxial inductance-capacitance circuits are coupled together.

* * * * *